US012622091B2

(12) United States Patent
Chen et al.

(10) Patent No.: US 12,622,091 B2
(45) Date of Patent: May 5, 2026

(54) LIGHT-EMITTING PHOTOSENSITIVE SENSOR STRUCTURE AND MANUFACTURING METHOD THEREOF

(71) Applicant: Zhuhai ACCESS Semiconductor Co., Ltd, Guangdong (CN)

(72) Inventors: Xianming Chen, Guangdong (CN); Lei Feng, Guangdong (CN); Benxia Huang, Guangdong (CN); Jiangjiang Zhao, Guangdong (CN); Zhijun Zhang, Guangdong (CN)

(73) Assignee: Zhuhai ACCESS Semiconductor Co., Ltd, Guangdong (CN)

( * ) Notice: Subject to any disclaimer, the term of this patent is extended or adjusted under 35 U.S.C. 154(b) by 389 days.

(21) Appl. No.: 18/220,877

(22) Filed: Jul. 12, 2023

(65) Prior Publication Data

US 2024/0021740 A1     Jan. 18, 2024

(30) Foreign Application Priority Data

Jul. 12, 2022     (CN) .......................... 202210820313.6

(51) Int. Cl.
| | |
|---|---|
| *H10F 77/50* | (2025.01) |
| *H10F 55/00* | (2025.01) |
| *H10F 71/00* | (2025.01) |
| *H10F 77/40* | (2025.01) |
| *H10F 77/60* | (2025.01) |

(52) U.S. Cl.
CPC ............. *H10F 77/50* (2025.01); *H10F 55/18* (2025.01); *H10F 71/00* (2025.01); *H10F 77/407* (2025.01); *H10F 77/60* (2025.01)

(58) Field of Classification Search
CPC ........ H10F 77/50; H10F 55/18; H10F 77/407; H10F 77/60
See application file for complete search history.

(56) References Cited

U.S. PATENT DOCUMENTS 4,611,886 A  *  9/1986  Cline ................... G02B 6/4255
                                                    250/227.24
7,547,151 B2 *  6/2009  Nagasaka ............ G02B 6/4214
                                                    385/88

* cited by examiner

*Primary Examiner* — Matthew L Reames
(74) *Attorney, Agent, or Firm* — The PL Law Group, PLLC

(57)               ABSTRACT

A method for manufacturing a light-emitting photosensitive sensor structure includes preparing a package substrate, wherein the package substrate has a cavity formed by a light-shield frame performing enclosing, and the bottom of the cavity is provided with a first line layer, forming a light transmission channel on the light-shield frame, mounting a light-emitting photosensitive sensor in the cavity of the package substrate so that the photosensitive luminescent device is electrically connected to the first line layer, filling the cavity and the light transmission channel with a transparent encapsulating material to form a transparent packaging layer on the photosensitive luminescent device, forming a light-shield layer on the transparent packaging layer, and performing cutting along a cutting line of the light-shield frame to obtain a light-emitting photosensitive sensor structure having a directional light transmission channel.

9 Claims, 5 Drawing Sheets

10

LIGHT-EMITTING PHOTOSENSITIVE SENSOR STRUCTURE AND MANUFACTURING METHOD THEREOF

CROSS-REFERENCE TO RELATED APPLICATION AND CLAIM OF PRIORITY

This application claims the benefit under 35 USC § 119 of Chinese Patent Application No. 2022108203136, filed on Jul. 12, 2022, in the China Intellectual Property Office, the entire disclosure of which is incorporated herein by reference for all purposes.

BACKGROUND

1. Technical Field

The present application relates to the technical field of electronic device packaging, and in particular to a light-emitting photosensitive sensor structure and a manufacturing method thereof.

2. Background

With the development of the electronic industry, electronic products are increasingly trending towards high integration, multifunction, high performance, and miniaturization. Therefore, embedded package substrates that can provide multiple device layouts are becoming increasingly dominant. Moreover, in an embedded packaging structure, metal wires are usually used as the transmission medium of data signals. However, metal wires have many limitations, for example, metal wires have limited conductivity affected by the material, and it is difficult to improve the signal transmission speed by increasing the conductivity; in the process of signal transmission, metal wires are vulnerable to external and mutual electromagnetic interference, especially in high-frequency transmission, so additional shielding measures are needed, and such shielding protection measures cause considerable difficulties for circuit design; in addition, metal wires transmit analog signals, which need to be converted during digital processing, making it prone to distortion.

In order to improve the above limitations of metal wires, a method for using optical signals to replace electrical signals for signal transmission is developed. The most obvious effect is that the optical signal is hardly interfered with by electromagnetic waves. So the signal transmission quality is good and the situations of signal transmission distortion can be reduced; also, the design of the electromagnetic shielding structure can be reduced. Therefore, optical signal transmission has become the direction of future development, and embedding a light-emitting photosensitive sensor for optical communication into a package is an inevitable choice to realize its miniaturization and integration.

The light-emitting photosensitive sensor structure in the prior art is generally provided with a transparent material on the light-emitting photosensitive sensor to form a package, but the photosensitive luminescence direction of the light-emitting photosensitive sensor is difficult to control. As it has no directionality, it cannot satisfy the requirement of having light direction selectivity.

SUMMARY

In view of this, an aspect of this application is to propose a light-emitting photosensitive sensor packaging element and a manufacturing method.

An aspect of the present application provides a manufacturing method for a light-emitting photosensitive sensor structure, including the following steps:

(a) preparing a package substrate, wherein the package substrate is formed with a cavity enclosed by a light-shield frame, and a first line layer is formed on the bottom of the cavity;

(b) forming a light transmission channel on the light-shield frame, wherein the light transmission channel extends beyond a cutting line of the light-shield frame;

(c) installing a light-emitting photosensitive sensor in the cavity of the package substrate so that the light-emitting photosensitive sensor is electrically connected to the first line layer;

(d) filling the cavity and the light transmission channel with a transparent packaging material to form a transparent packaging layer on the light-emitting photosensitive sensor;

(e) forming a light-shield layer on the transparent packaging layer; and (f) obtaining a light-emitting photosensitive sensor structure having a directional light transmission channel by cutting along a cutting line of the light-shield frame.

In some embodiments, in step (b), the height of the light-shield frame exceeds that of the light-emitting photosensitive sensor installed in the cavity.

In some embodiments, the cutting line of the light-shield frame intersects with the light transmission channel.

In some embodiments, in step (d), the transparent packaging layer is arc-shaped.

In some embodiments, in step (e), the first line layer is connected to a second line layer on the back face of the package substrate via a conducting post penetrating through the package substrate.

In some embodiments, step (c) further comprises:

mounting the light-emitting photosensitive sensor on the first heat dissipation layer of the package substrate; and connecting the first heat dissipation layer to a second heat dissipation layer on the back face of the package substrate via a heat conducting post penetrating through the package substrate.

In some embodiments, the cross-section of the light transmission channel is groove-shaped.

In some embodiments, the material of the transparent packaging layer is an optically clear resin (OCR) glue or an optically clear adhesive (OCA) glue.

In some embodiments, the material of the light-shielding layer is chromium, chromium oxide, or black resin.

Embodiments of the present application also provide a light-emitting photosensitive sensor structure prepared by using the manufacturing method for a light-emitting photosensitive sensor structure as previously described.

The embodiments of the present application also provide a light-emitting photosensitive sensor structure, including a package substrate having a cavity enclosed by a light-shield frame; wherein the light-shield frame is provided thereon with a light transmission channel leading to outside, and a first line layer is formed on the bottom of the cavity;

a light-emitting photosensitive sensor provided in the cavity and electrically connected to the first line layer;

a transparent packaging layer filled in the cavity and the light transmission channel; and a light-shield layer provided on the transparent packaging layer such that the light-emitting photosensitive sensor structure has a selective light-emitting and light-receiving direction along the light transmission channel.

In some embodiments, the height of the light-shield frame exceeds that of the light-emitting photosensitive sensor installed in the cavity.

In some embodiments, the transparent packaging layer is arc-shaped.

In some embodiments, the first line layer is connected to a second line layer on the back face of the package substrate via a conducting post penetrating through the package substrate.

In some embodiments, the light-emitting photosensitive sensor is mounted on the first heat dissipation layer of the package substrate;

the first heat dissipation layer is connected to a second heat dissipation layer on the back face of the package substrate via a heat conducting post penetrating through the package substrate.

It can be seen from the above that the light-emitting photosensitive sensor structure and manufacturing method thereof provided in the present application form a light-shield environment around the light-emitting photosensitive sensor and transmit light only through a light transmission channel, so that the light-emitting photosensitive sensor can only emit and receive light along the light transmission channel, and has a fixed light emitting and receiving direction along the light transmission channel, thereby achieving the effect of selective light direction.

BRIEF DESCRIPTION OF THE DRAWINGS

In order to illustrate the technical solutions of the present application or in the related art more clearly, the following will briefly introduce the drawings that need to be used in the description of the embodiments or the related art. Obviously, the drawings in the following description are merely embodiments of the present application. For those of ordinary skills in the art, other drawings can be obtained according to these drawings without involving inventive efforts.

DETAILED DESCRIPTION OF THE EMBODIMENTS

In order to make the purpose, technical solution, and advantages of the present application clearer, the present application will be further described in detail below in conjunction with specific embodiments and with reference to the accompanying drawings.

It needs to be noted that, unless otherwise defined, technical or scientific terms used in the embodiments of the present application shall have the general meaning as understood by one of ordinary skills in the art to which the present application belongs. The "first", "second", and similar words used in the embodiments of the present application do not denote any order, quantity, or importance, but are only used to distinguish different constituent parts. Similar words such as "including" or "containing" mean that the element or object appearing before the word covers the element or object listed appearing after the word and its equivalents, without excluding other elements or objects. Similar terms such as "connection" or "connected" are not limited to physical or mechanical connections, but can include electrical connections, whether direct or indirect. "Up", "down", "left", "right", etc. are only used to represent the relative position relationship. When the absolute position of the described object changes, the relative position relationship can also change accordingly.

Some light-emitting photosensitive sensor structures have no directionality for light, e.g., light can be emitted or received to/from both the upper side and the periphery simultaneously. It is unable to meet the requirements such as fixed-directional light emitting and receiving.

Figure 1:
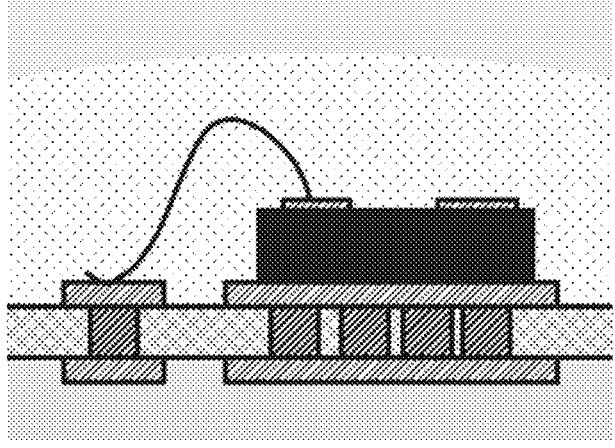
FIG. 1 is a cross-sectional view of a light-emitting photosensitive sensor structure in the related art.

FIG. 1 shows a manufacturing method for a light-emitting photosensitive sensor structure in the prior art. The light-emitting photosensitive sensor structure prepared in the prior art simultaneously emits and receives light to/from the upper side and the periphery without directionality.

Based on this, the embodiments of the present application provide a manufacturing method for a light-emitting photosensitive sensor structure, which can solve the problem of non-directionality of emitting and receiving light of the light-emitting photosensitive sensor structure to a certain extent.

Figures 2, 3:
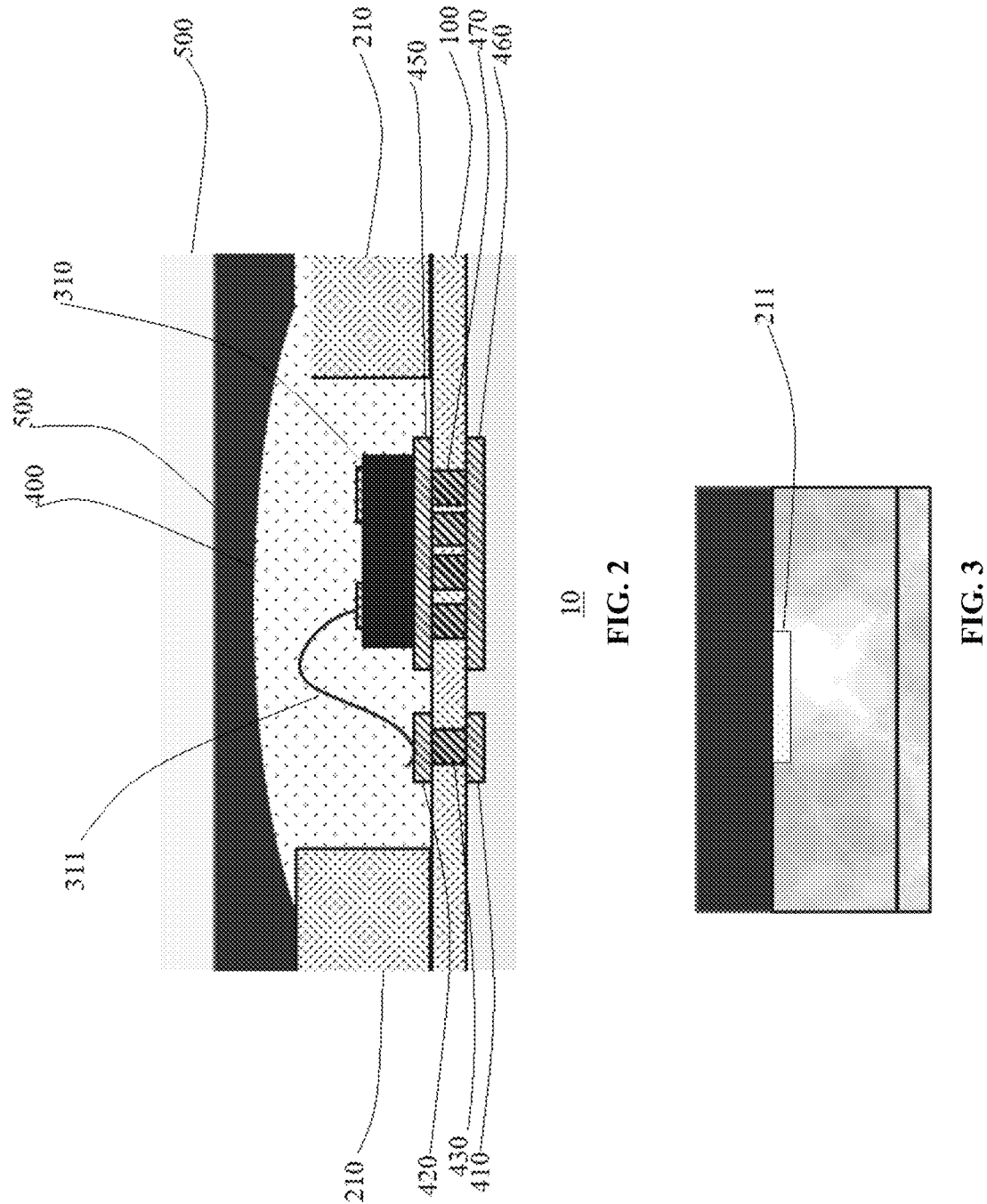
FIG. 2 shows a side view of a light-emitting photosensitive sensor structure provided in an embodiment of the present application.
FIG. 3 shows a cross-sectional view of a light-emitting photosensitive sensor structure provided in an embodiment of the present application.

FIG. 2 to FIG. 3 show a structural view of a light-emitting photosensitive sensor structure provided in an embodiment of the present application. FIG. 2 shows a side view of a light-emitting photosensitive sensor structure provided in an embodiment of the present application. FIG. 3 shows a cross-sectional view of a light-emitting photosensitive sensor structure provided in an embodiment of the present application.

Referring to FIGS. 2-3, a light-emitting photosensitive sensor structure 10 provided by an embodiment of the present application can include a package substrate 100 having a cavity enclosed by a light-shield frame 210. That is, the light-emitting photosensitive sensor structure 10 further includes a light-shield frame 210 enclosing the package substrate 100 to form a cavity. A light transmission channel 211 penetrating through the light-shield frame 210 and opening to outside is formed on the light-shield frame 210, and the cross section of the light transmission channel 211 can be a groove shape. The light-emitting photosensitive sensor 310 is mounted in the cavity and electrically connected to the first line layer 420 on the package substrate in the cavity. A transparent packaging layer 400 is provided on the light-emitting photosensitive sensor 310, and the transparent packaging layer 400 can fill the cavity and the groove-shaped light transmission channel 211. A light-shield layer 500 is provided above the transparent packaging layer 400.

The light-emitting photosensitive sensor structure 10 provided in the embodiments of the present application can transmit light only through the light transmission channel 211 by forming a light-shield environment around the light-emitting photosensitive sensor 310, so that the light-emitting photosensitive sensor structure 10 can only emit and receive light along the light transmission channel, and has a fixed light emitting and receiving direction along the light transmission channel 211, thereby achieving the effect of selective light direction.

In some embodiments, with reference to FIG. 2, a second line layer 410 is provided on the backside of the package substrate 100 away from the cavity and a first line layer 420 is provided on the other side proximate the cavity. A conducting post 430 is formed through the package substrate 100 for electrically connecting the first line layer 420 with the second line layer 410.

The first line layer 420 includes a first heat dissipation layer 450, and the second line layer 410 includes a second heat dissipation layer 460; the light-emitting photosensitive sensor 310 can be mounted on the first heat dissipation layer 450 by, for example, a heat conductive adhesive; the first heat dissipation layer 450 can be connected to the second heat dissipation layer 460 via a heat conducting post 470 penetrating through the package substrate 100, so that the heat generated by the light-emitting photosensitive sensor 310 can be dissipated to outside of the package substrate. The terminal face of the light-emitting photosensitive sensor 310 can be connected to the first line layer 420 via a wire 311, and electrically connected to the second line layer 410 via a conducting post 430.

Based on the same inventive concept, the present application also provides a manufacturing method for a light-emitting photosensitive sensor structure 10 corresponding to the light-emitting photosensitive sensor structure 10 of any of the embodiments described above.

Referring to FIGS. 4A to 4H, a schematic cross-sectional view of an intermediate structure of various steps of a manufacturing method for the light-emitting photosensitive sensor structure 10 in FIG. 3 is shown.

Figures 4A, 4B, 4C:
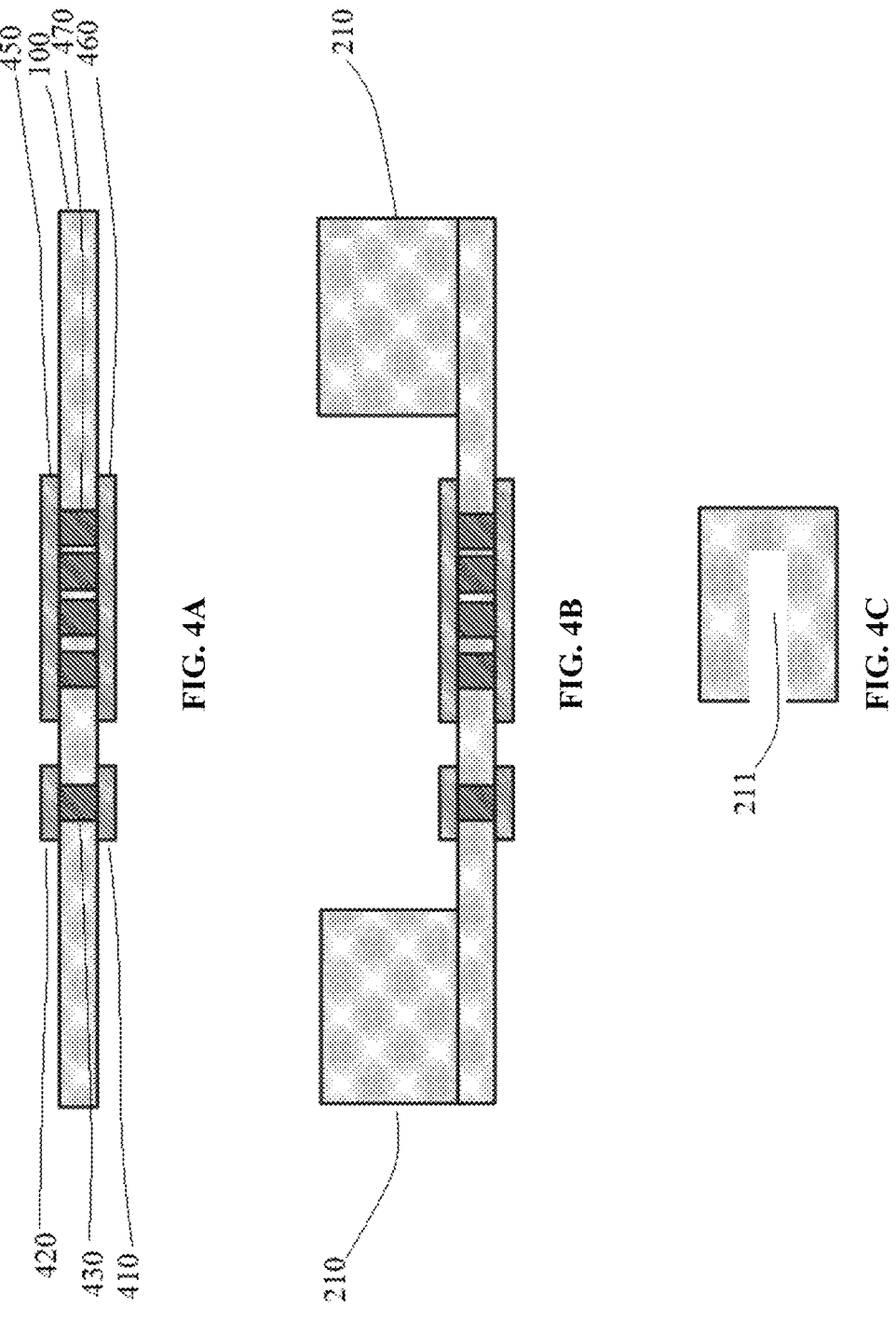
FIGS. 4A-4H show schematic cross-sectional views of an intermediate structure of various steps of a manufacturing method for a cavity package substrate shown in FIG. 3.

The manufacturing method for a light-emitting photosensitive sensor structure includes the following steps: preparing a package substrate 100-step (a). As shown in FIG. 4A, the package substrate 100 includes a first line layer 420, a second line layer 410, a first heat dissipation layer 450, a second heat dissipation layer 460, a conducting post 430 conducting the first line layer 420 and the second line layer 410, and a heat dissipation conducting post 470 conducting the first heat dissipation layer 450 and the second heat dissipation layer 460.

The package substrate 100 can be formed by a conventional patterning method, which will not be described in detail herein.

Then, as shown in FIG. 4B, a frame 210 having a cavity is formed on the package substrate 100, the frame 210 is a light-shield frame 210 formed on the upper surface of the package substrate 100 by a light-proof material, and the cross section of the light-shield frame 210 can be hemispherical so as to shield light in all directions.

Figures 4D, 4E, 4F:
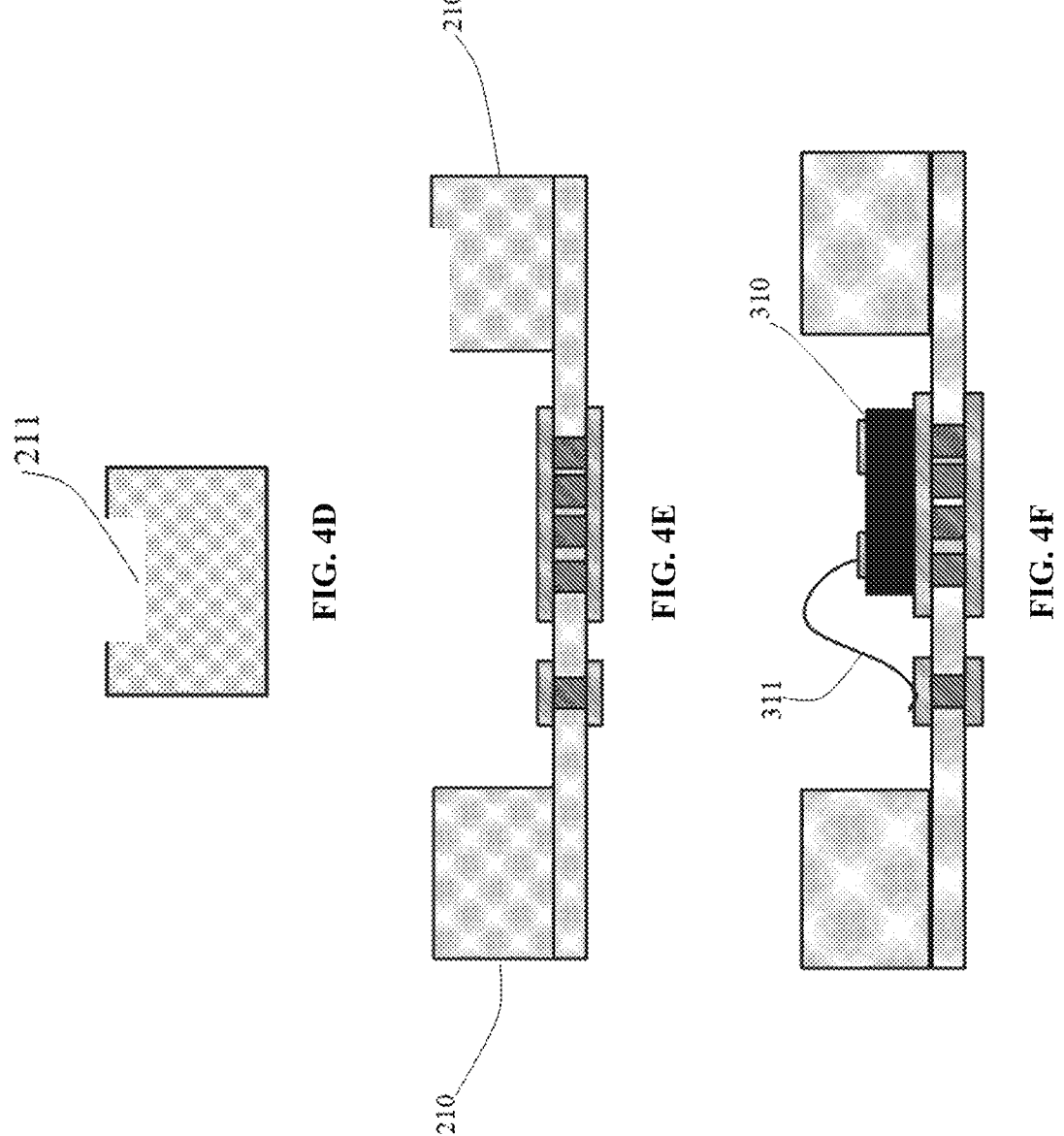

Next, in step (b), a light transmission channel 211 can be formed on the light-shield frame 210, and the light transmission channel 211 can extend beyond the cut line of the light-shield frame, as shown in FIG. 4C and FIG. 4D. For example, the light transmission channel 211 can be rectangular in cross-section, or can be any shape, without any limitation herein.

The light transmission channel 211 can form into a groove shape by a simple milling operation, as shown in FIG. 4E. At that, it can be convenient to allow the transparent packaging layer 400 to easily fill the light transmission channel 211 when the transparent packaging layer 400 is subsequently formed.

Next, in step (c), the light-emitting photosensitive sensor 310 is mounted on the package substrate 100 such that the terminal of the light-emitting photosensitive sensor is electrically connected to the first line layer 420, as shown in FIG. 4F. Generally, the terminal of the light-emitting photosensitive sensor can be electrically connected to the first line layer 420 via a wire. For example, step (c) can specifically include:

mounting the light-emitting photosensitive sensor 310 on the first heat dissipation layer 450; and electrically connecting the light-emitting photosensitive sensor 310 to the first line layer 420 via a conductive wire 311.

Specifically, a back surface or a heat dissipation surface of the light-emitting photosensitive sensor 310 can be fixedly mounted on the first heat dissipation layer 450 by, for example, a thermally conductive adhesive, so that the heat generated during operation of the light-emitting photosensitive sensor 310 can be conducted to the second heat dissipation layer 460 through the first heat dissipation layer 450 via the heat conducting post 470 for heat dissipation. The second heat dissipation layer 460 can also be connected to an external heat sink to further improve heat dissipation efficiency.

Then, in step (d), the transparent packaging layer 400 is formed on the light-emitting photosensitive sensor 310 while the light transmission channel 211 is filled so that the transparent packaging layer 400 fills the light transmission channel 211. The transparent packaging layer 400 can cover a portion of the light-shield frame 210, so that the transparent packaging layer 400 having a certain radian can be formed. That is, the transparent packaging layer 400 forms a cambered transparent packaging layer 400 at the side remote from the light-emitting photosensitive sensor 310, as shown in FIG. 4G.

The transparent encapsulating material of the transparent packaging layer 400 can be OCR (Optical Clear Resin) glue or OCA (Optically Clear Adhesive) glue. The OCR glue and OCA glue are glue solutions, which are colorless and transparent with high light transmittance and good bonding strength, can be cured under normal temperature, medium temperature, or UV conditions with low cure shrinkage rate, resistance to yellowing, and like features.

Figures 4G, 4H:
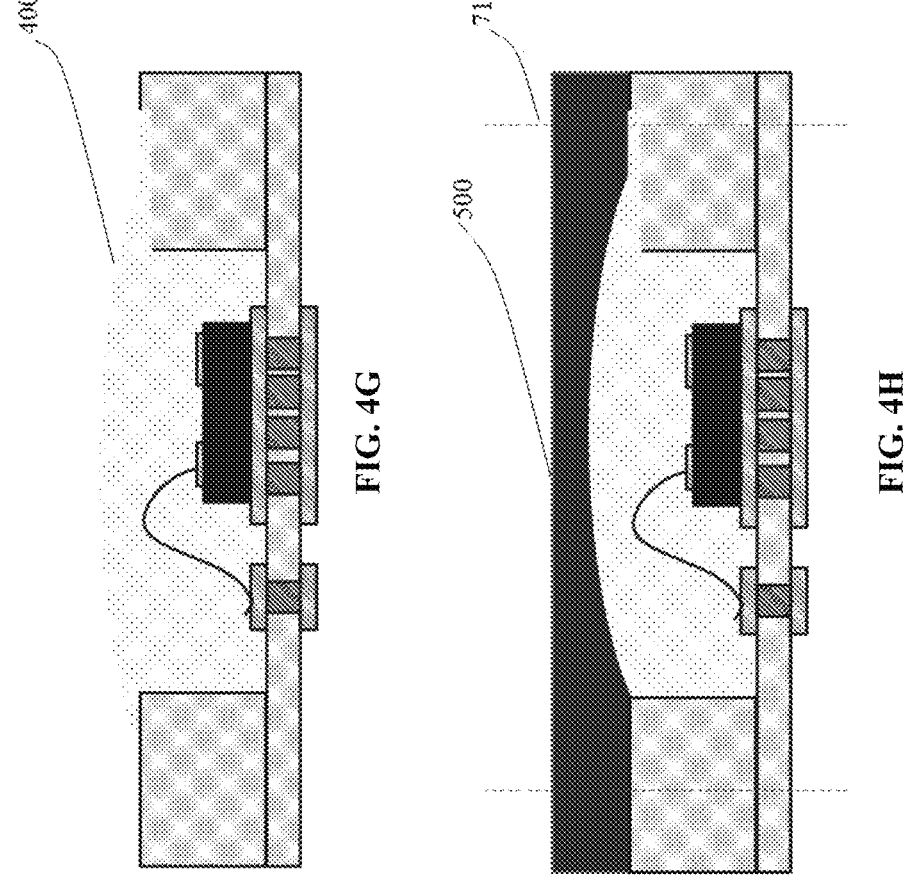

Next, in step (e), a light-shield layer 500 is formed on the transparent packaging layer 400, as shown in FIG. 4H. It should be understood that one side of the light-shield layer 500 close to the transparent packaging layer 400 can have an arc shape so as to adapt to the shape of the transparent packaging layer 400; the side remote from the transparent packaging layer 400 can be flat or can be of any shape according to design requirements.

The light-shield layer 500 is made of chromium, chromium oxide, black resin, or the like. For example, when the material of the light-shield layer 500 is chromium, the light-shield layer 500 is an opaque metal film that has reflectivity to light. In this way, when the intensity of the light transmitted from the light transmission channel 211 is weak, the light entering the cavity along the light transmission channel 211 can be converged at the light-emitting photosensitive sensor 310 by being reflected by the light-shield layer 500, thereby increasing the intensity of the light.

Finally, in step (g), cutting is performed along a cutting line 710 of the light-shield frame 210 to obtain a light-emitting photosensitive sensor structure 10 with a directional light transmission channel, as shown in FIG. 3. The cutting line 700 can pass through the light transmission channel 211 such that an end face exposing the light transmission channel 211 after cutting forms a light passageway. Cutting can be performed by using a rotating saw blade or other cutting techniques, such as a laser, along the cutting line 710, resulting in a light-emitting photosensitive sensor structure 10 having a directional light transmission channel as shown in FIG. 2.

Those of ordinary skill in the art should understand that the discussion of any embodiment above is merely exemplary and is not intended to imply that the scope of the application (including the claims) is limited to these examples; combinations of technical features in the above embodiments, or between different embodiments, can also be made under the concept of the present application; the steps can be implemented in any order, and there can be many other variations of the different aspects of the embodiments of the present application as described above, which are not provided in detail for concision.

In addition, to simplify the explanation and discussion, and to avoid making the embodiments of the present application difficult to understand, well-known power source/ grounding connections with integrated circuit (IC) chips and other components can or cannot be shown in the provided drawings. In addition, the device can be shown in the form of a block diagram to avoid making the embodiments of the present application difficult to understand, and this also takes into account the fact that the details of the implementation modes of these block diagram devices are highly dependent on the platform on which the embodiments of the present application are to be implemented (i.e., these details should be fully within the understanding range of those skilled in the art). In the case where specific details (such as circuits) are elaborated to describe exemplary embodiments of the present application, it is apparent to those skilled in the art that the embodiments of the present application can be implemented without these specific details or with changes in these specific details. Accordingly, the description is to be regarded as illustrative rather than restrictive.

Although the present application has been described in conjunction with specific embodiments thereof, based on the previous description, many substitutions, modifications, and variations of these embodiments will be apparent to ordinary technical personnel in the art. For example, other memory architectures (such as Dynamic RAM (DRAM)) can use the discussed embodiments.

The embodiments of the present application are intended to cover all such substitutions, modifications, and variations that fall within the broad scope of the appended claims. Therefore, any omission, modification, equivalent replacement, improvement, etc. made within the spirit and principles of the embodiments of the present application should be included in the scope of protection of the present application.

What is claimed is:

1. A method for manufacturing a light-emitting photosensitive sensor structure, the method comprising:
   preparing a package substrate, wherein the package substrate is formed with a cavity enclosed by a light-shield frame, and a first line layer is formed on the bottom of the cavity;

forming a light transmission channel on the light-shield frame, wherein the light transmission channel extends beyond a cutting line of the light-shield frame;

installing a light-emitting photosensitive sensor in the cavity of the package substrate so that the light-emitting photosensitive sensor is electrically connected to the first line layer;

filling the cavity and the light transmission channel with a transparent packaging material to form a transparent packaging layer on the light-emitting photosensitive sensor;

forming a light-shield layer on the transparent packaging layer; and obtaining a light-emitting photosensitive sensor structure having a directional light transmission channel by cutting along a cutting line of the light-shield frame.

2. The method according to claim 1, wherein in the forming of the light transmission channel, a height of the light-shield frame exceeds that of the light-emitting photosensitive sensor installed in the cavity.

3. The method according to claim 1, wherein the cutting line of the light-shield frame intersects with the light transmission channel.

4. The method according to claim 1, wherein in the filling of the cavity and the light transmission channel, the transparent packaging layer is arc-shaped.

5. The method according to claim 1, wherein the first line layer is connected to a second line layer on a back face of the package substrate via a conducting post penetrating through the package substrate.

6. The method according to claim 1, wherein the installing of the light-emitting photosensitive sensor further comprises:
   mounting the light-emitting photosensitive sensor on a first heat dissipation layer of the package substrate; and
   connecting the first heat dissipation layer to a second heat dissipation layer on a back face of the package substrate via a heat conducting post penetrating through the package substrate.

7. The method according to claim 1, wherein a cross section of the light transmission channel is groove-shaped.

8. The method according to claim 1, wherein the transparent packaging layer is made of an optically clear resin (OCR) glue or an optically clear adhesive (OCA) glue.

9. The method according to claim 1, wherein the light-shield layer is made of chromium, chromium oxide, or black resin.

* * * * *